US012593446B2

(12) United States Patent
Shuai et al.

(10) Patent No.: US 12,593,446 B2
(45) Date of Patent: Mar. 31, 2026

(54) SEMICONDUCTOR DEVICE

(71) Applicant: United Microelectronics Corp.,
Hsinchu (TW)

(72) Inventors: Hung Hsun Shuai, Tainan City (TW);
Chih-Jung Chen, Hsinchu County
(TW)

(73) Assignee: United Microelectronics Corp.,
Hsinchu (TW)

( * ) Notice: Subject to any disclaimer, the term of this
patent is extended or adjusted under 35
U.S.C. 154(b) by 395 days.

(21) Appl. No.: 18/306,231

(22) Filed: Apr. 24, 2023

(65) Prior Publication Data

US 2024/0324197 A1      Sep. 26, 2024

(30) Foreign Application Priority Data

Mar. 20, 2023      (TW) ................................. 112110227

(51) Int. Cl.
*H10B 41/40*          (2023.01)
*H01L 23/60*          (2006.01)
*H10B 41/30*          (2023.01)

(52) U.S. Cl.
CPC ............. *H10B 41/40* (2023.02); *H01L 23/60*
(2013.01); *H10B 41/30* (2023.02)

(58) Field of Classification Search
CPC ........ H10B 41/40; H10B 41/30; H10B 41/42;
H10B 43/40; H01L 23/60; H01L 23/481;
H01L 23/5283
See application file for complete search history.

(56) References Cited

U.S. PATENT DOCUMENTS 6,545,309 B1 *   4/2003   Kuo ................... G11C 16/0466
                                                           257/302
7,151,302 B1    12/2006   Chindalore
                   (Continued)

FOREIGN PATENT DOCUMENTS

JP          H0223663          1/1990
JP          2001352041        12/2001
JP          2010272649        12/2010
                   (Continued)

OTHER PUBLICATIONS

"Office Action of Japan Counterpart Application", issued on Jun. 18, 2024, p. 1-p. 4.
                   (Continued)

*Primary Examiner* — Allison Bernstein
(74) *Attorney, Agent, or Firm* — JCIPRNET

(57) ABSTRACT

A semiconductor device includes a substrate, a doped ring, a plurality of contacts, and a plurality of conductive lines. The substrate includes a first region and a second region surrounding the first region. The doped ring is located in the substrate in the second region and surrounds the first region. The doped ring includes a first doped region and a plurality of second doped regions. The first doped region is located in the substrate in the second region and surrounds the first region. The first doped region has an opening. The second doped regions are separated from each other and located in the substrate of the opening. The contacts are electrically connected to the second doped regions. The conductive lines are connected to the contacts and a plurality of conductive layers in the first region.

19 Claims, 12 Drawing Sheets

(56)     References Cited

U.S. PATENT DOCUMENTS

| 10,163,641 | B2 | 12/2018 | Lee et al. | |
| 2010/0295111 | A1* | 11/2010 | Kawashima | ......... H10D 89/611 |
| | | | | 438/237 |

FOREIGN PATENT DOCUMENTS

| JP | 2012256877 | 12/2012 |
| KR | 20150087006 | 7/2015 |

OTHER PUBLICATIONS

"Office Action of Japan Counterpart Application", issued on Oct. 1, 2024, pp. 1-4.

* cited by examiner

SEMICONDUCTOR DEVICE

CROSS-REFERENCE TO RELATED APPLICATION

This application claims the priority benefit of Taiwan application serial no. 112110227, filed on Mar. 20, 2023. The entirety of the above-mentioned patent application is hereby incorporated by reference herein and made a part of this specification.

BACKGROUND

Technical Field

The present disclosure relates to an integrated circuit, and particularly relates to a semiconductor device.

Description of Related Art

Plasma is often used in deposition and etching processes in a semiconductor manufacturing process. However, during the process, plasma discharge may cause damage to a semiconductor device. For example, the use of plasma in the semiconductor back-end process is likely to damage the gate dielectric layer of a memory device on a substrate due to the discharge, resulting in a decrease in the retention performance of the memory device.

SUMMARY

The embodiment of the present disclosure provides a semiconductor device capable of protecting a memory, preventing plasma from damaging the gate dielectric layer or the tunneling layer of a memory, and improving the retention performance of the memory.

A semiconductor device according to an embodiment of the present disclosure includes a substrate, a doped ring, a plurality of contacts, and a plurality of conductive lines. The substrate includes a first region and a second region surrounding the first region. The doped ring is located in the substrate in the second region and surrounds the first region. The doped ring includes a first doped region and a plurality of second doped regions. The first doped region is located in the substrate in the second region and surrounds the first region. The first doped region has an opening. The second doped regions are separated from each other and located in the substrate of the opening. The contacts are electrically connected to the second doped regions. The conductive lines are connected to the contacts and a plurality of conductive layers in the first region.

A semiconductor device according to another embodiment of the present disclosure includes a substrate, a plurality of memory devices, a plurality of diodes, a plurality of contacts and a plurality of conductive lines. The substrate includes a first region and a second region surrounding the first region. The memory devices are located in the first region. The diodes are located in the substrate in the second region. The contacts are electrically connected to the diodes. The conductive lines are connected to the contacts and connected to the memory devices.

Based on the above, in the embodiment of the present disclosure, with the disposition of diodes (e.g., doped ring), the semiconductor structure is capable of protecting a memory device, preventing plasma used in the subsequent metallization process from damaging the gate dielectric layer of the memory device, and improving the retention performance of the memory device.

DESCRIPTION OF THE EMBODIMENTS

Figure 1A:
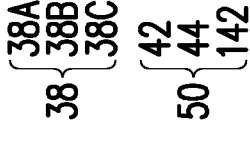
FIG. 1A is a top view of a semiconductor device according to an embodiment of the present disclosure.
Figure 1B:
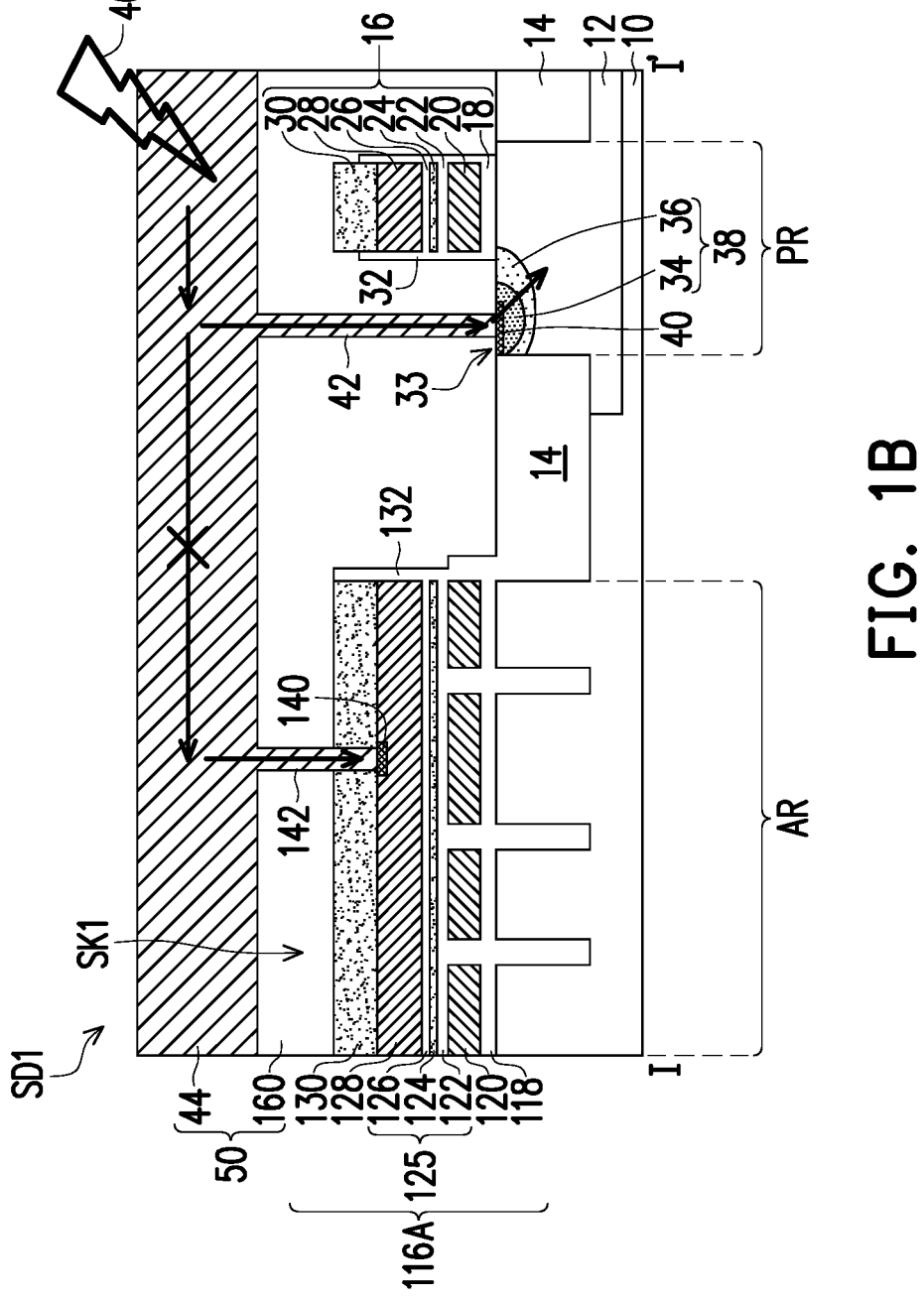
FIG. 1B is a cross-sectional view taken along the line I-I' of FIG. 1A.
Figure 1C:
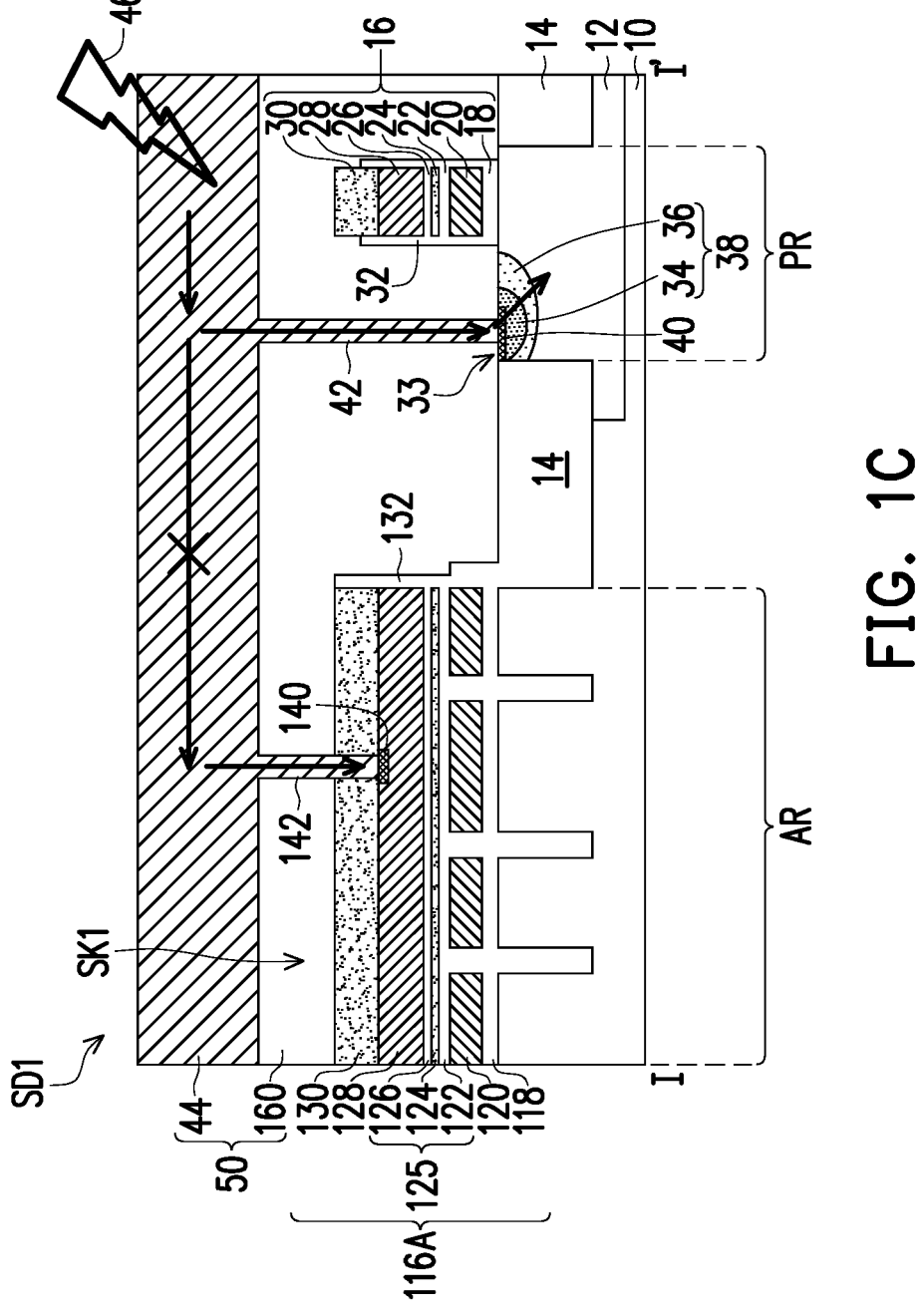
FIG. 1C is another cross-sectional view taken along the line I-I' of FIG. 1A.

FIG. 1A is a top view of a semiconductor device according to an embodiment of the present disclosure. FIG. 1B is a cross-sectional view taken along the line I-I' of FIG. 1A. FIG. 1C is another cross-sectional view taken along the line I-I' of FIG. 1A.

Referring to FIG. 1A and FIG. 1B, a semiconductor device SD1 according to an embodiment of the present disclosure includes a substrate 10, multiple memory devices 116A, a guard ring 16, multiple diodes 33, multiple contacts 42, and multiple conductive lines 44. The substrate 10 may include a semiconductor or a semiconductor compound. The semiconductor includes silicon, such as bulk silicon or silicon-on-insulator (SOI). The semiconductor compound includes germanium silicide. An isolation structure 14 is located in the substrate 10. The isolation structure 14 may include silicon oxide, silicon nitride or a combination thereof. The isolation structure 14 defines a first region AR and a second region PR of the substrate 10. The first region AR is, for example, a memory array region. The second region PR is, for example, a periphery region. The second region PR surrounds the first region AR.

Multiple memory devices 116A are located in an area 100A of the first region AR. The memory devices 116A may be arranged in rows and columns to form a memory array. The memory devices 116A may be flash memory devices. Flash memory devices can have various structures. For example, the flash memory device includes a tunneling layer 118, a floating gate layer 120, an inter-gate dielectric layer 125, a control gate layer 128, a cap layer 130 and a spacer 132. The tunneling layer 118, the floating gate layer 120, the inter-gate dielectric layer 125, the control gate layer 128, and the cap layer 130 are stacked from bottom to top to form a gate stack structure SK1. The tunneling layer 118 may include silicon oxide. The floating gate layer 120 may include polysilicon. The inter-gate dielectric layer 125 includes, for example, a silicon oxide layer 122, a silicon nitride layer 124 and a silicon oxide layer 126. The control gate layer 128 may include polysilicon. The cap layer 130 may include silicon nitride. The spacer 132 covers the sidewall of the gate stack structure SK1 formed by the tunneling layer 118, the floating gate layer 120, the inter-gate dielectric layer 125, the control gate layer 128 and the cap layer 130.

Referring to FIG. 1A, the semiconductor device SD1 may further include multiple dummy memory devices 116A'. Multiple dummy memory devices 116A' are located in the first region AR outside of the area 100A. The dummy memory devices 116A' may have similar configuration and components as those of the memory devices 116A.

Referring to FIG. 1A and FIG. 1B, the guard ring 16 is located on the substrate 10 in the second region PR. The guard ring 16 is a closed ring surrounding the boundary of the memory devices 116A, which can reduce the influence of the load effect caused by different densities of the first region AR and the second region PR in the manufacturing process, so as to protect the memory devices 116A. The configuration of the guard ring 16 may be similar to that of the gate stack structure SK1 of the memory device 116A. In some embodiments, the guard ring 16 may include a dielectric layer 18, a conductive layer 20, dielectric layers 22, 24 and 26, a conductive layer 28, a cap layer 30 and a spacer 32. The materials of the dielectric layer 18, the conductive layer 20, the dielectric layers 22, 24 and 26, the conductive layer 28, the cap layer 30 and the spacer 32 are the same as materials of the tunneling layer 118, the floating gate layer 120, the inter-gate dielectric layer 125, the control gate layer 128 and the cap layer 130, respectively, and the dielectric layer 18, the conductive layer 20, the dielectric layers 22, 24 and 26, the conductive layer 28, the cap layer 30 and the spacer 32 may be formed simultaneously with the tunneling layer 118, the floating gate layer 120, the inter-gate dielectric layer 125, the control gate layer 128 and the cap layer 130, respectively.

Referring to FIG. 1A and FIG. 1B, multiple diodes 33 of the embodiment of the present disclosure are arranged in the substrate 10 in the second region PR. Multiple diodes 33 include a well region 12 and a doped ring 38. The well region 12 extends from under one isolation structure 14 between the first region AR and the second region PR to the second region PR, and then extends to under another isolation structure 14 outside of the second region PR, but the disclosure is not limited thereto. The well region 12 may include a dopant of a first conductivity type. The dopant in the well region 12 may be P-type, such as boron or boron trifluoride. The dopant in the well region 12 may be N-type, such as phosphorus or arsenic.

Referring to FIG. 1A and FIG. 1B, the doped ring 38 and the guard ring 16 are both located within the boundary of the well region 12. The doped ring 38 is located adjacent to guard ring 16. The doped ring 38 and the guard ring 16 may partially overlap (as shown in FIG. 1B), or may not overlap (as shown in FIG. 1C) and may be separated from each other by a non-zero distance. The doped ring 38 is located inside of the guard ring 16, so the doped region 38 is closer to the first region AR than the guard ring 16.

Referring to FIG. 1A, the doped ring 38 is located in the well region 12 in the second region PR, as shown in FIG. 1B. Referring to FIG. 1A, the doped ring 38 includes a first doped region 38A and multiple second doped regions 38B. The first doped region 38A is a non-closed open ring, and is located in the well region 12 surrounding the first region AR, for example. In other words, the first doped region 38A has an opening 38C. The second doped regions 38B are located in the well region 12 of the opening 38C. The second doped regions 38B are island-shaped and separated from each other, for example. In other words, the doped ring 38 formed by the first doped region 38A and multiple second doped regions 38B is a non-closed ring.

Referring to FIG. 1A and FIG. 1B, each of the first doped region 38A and the second doped regions 38B of the doped ring 38 includes a lightly-doped region 36 and a heavily-doped region 34. The lightly-doped region 36 is located in the well region 12 and the heavily-doped region 34 is located in the lightly-doped region 36. The conductivity type of the dopant in the lightly-doped region and the heavily-doped region is different from the conductivity type of the dopant in the well region. The lightly-doped region 36 and the heavily-doped region 34 may include a dopant of a second conductivity type. The dopant of the lightly-doped region 36 and the heavily-doped region 34 may be N-type, such as phosphorus or arsenic. The dopant of the lightly-doped region 36 and the heavily-doped region 34 may be P-type, such as boron or boron trifluoride. The lightly-doped region 36 is located in well region 12 and adjacent to guard ring 16. The lightly-doped region 36 and the guard ring 16 may partially overlap (as shown in FIG. 1B), or may not overlap (as shown in FIG. 1C) and may be separated from each other by a non-zero distance. The heavily-doped region 34 and the guard ring 16 may not overlap (as shown in FIG. 1B and FIG. 1C) and may be separated from each other by a non-zero distance.

Referring to FIG. 1A and FIG. 1B, the interconnect structure 50 is located on the substrate 10. The interconnect structure 50 includes a dielectric layer 160, multiple contacts 42, 142 and multiple conductive lines 44.

Referring to FIG. 1B, the dielectric layer 160 may include silicon oxide. The dielectric layer 160 may have a flat surface through a planarization process. The contacts 42, 142 are formed in the dielectric layer 160. The contact 42 extends through the dielectric layer 160 and is electrically connected to the doped region 34. The contact 142 extends through the dielectric layer 160 and the cap layer 130 and is electrically connected to the control gate 128. The contacts 42 are electrically connected to the second doped regions 38B and ends E1 and E2 of the first doped region 38A, as shown in FIG. 1A.

Referring to FIG. 1A and FIG. 1B, the conductive line 44 is formed on the dielectric layer 160, extends from the first region AR to the second region PR. The conductive line 44 may be connected to the control gate 128 in the first region AR through the contact 142, and may be connected to the decoder. The conductive line 44 is also connected to the heavily-doped region 34 of the diode 33 through the contact 42. In other words, the contact 42 and the contact 142 are connected to the same conductive line 44, so they are at the same potential (equipotential).

In some embodiments, the semiconductor device SD1 further includes metal silicide layers 140 and 40 to reduce contact resistance. The metal silicide layer 140 is located between the contact 142 and the control gate layer 128. The metal silicide 40 is located between the contact 42 and the heavily-doped region 34.

Since the contact 42 is located outside of the first region AR. Therefore, in the subsequent metallization process, before plasma discharge 46 enters the first region AR, the conductive line 44 and the contact 42 serve as a discharge path to conduct the plasma discharge into the diode 33. Therefore, such configuration may prevent plasma discharge from damaging the tunneling layer (e.g., gate dielectric layer) 118 of the memory device, and improve the retention performance of the memory device. Since the contact 42 and the contact 142 may be formed through the same photomask, so an additional photomask is not required.

In the above embodiments, multiple diodes 33 are disposed between the guard ring 16 and the memory device 116A. In other embodiments, referring to FIG. 2A and FIG. 2B, diode 33 of the semiconductor device SD2 can also be located outside of the guard ring 16. That is, the guard ring 16 is disposed between the memory device 116A and the diode 33.

Figure 2A:
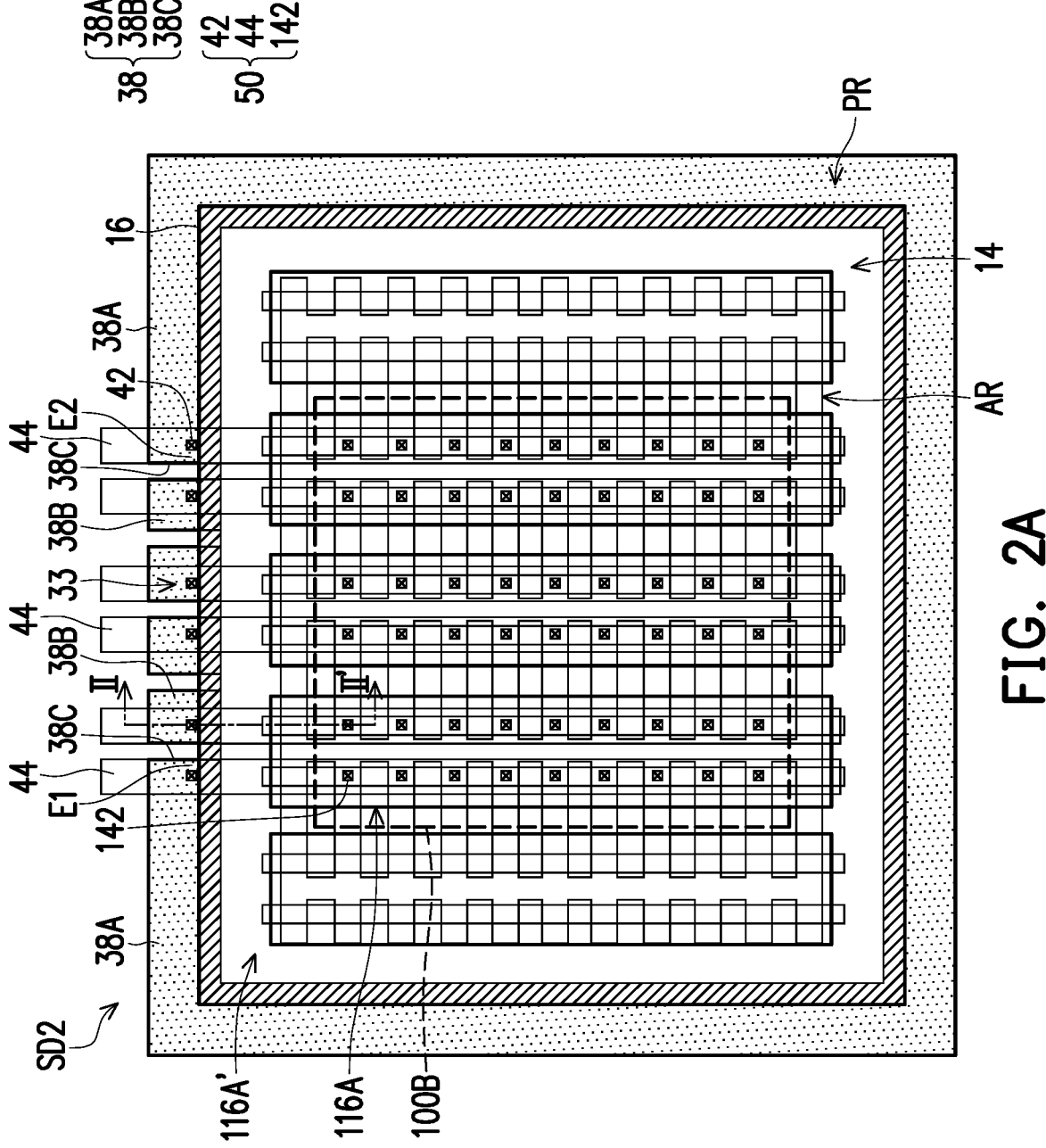
FIG. 2A is a top view of a semiconductor device according to an embodiment of the present disclosure.
Figure 2B:
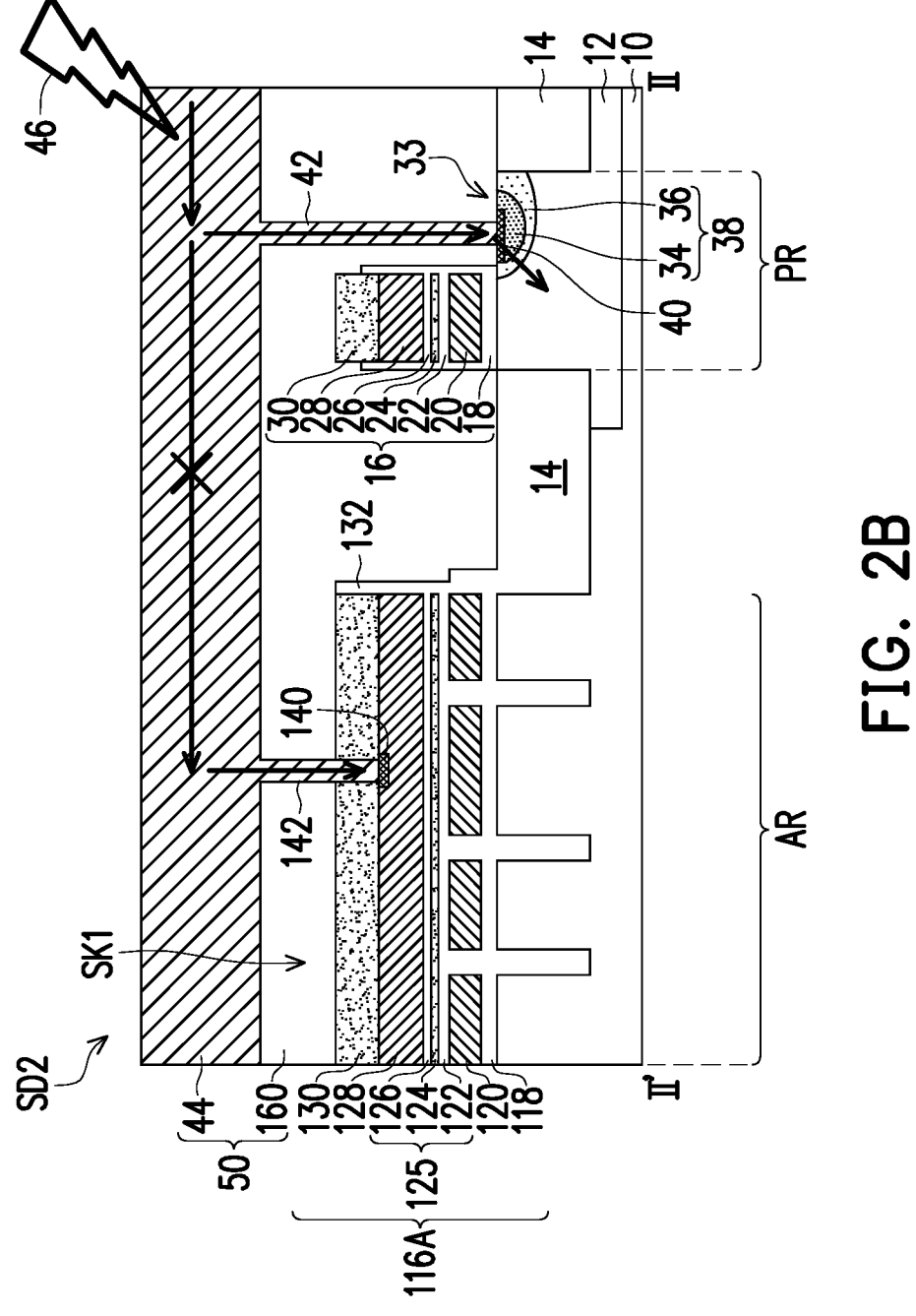
FIG. 2B is a cross-sectional view taken along the line II-II' of FIG. 2A.
Figure 2C:
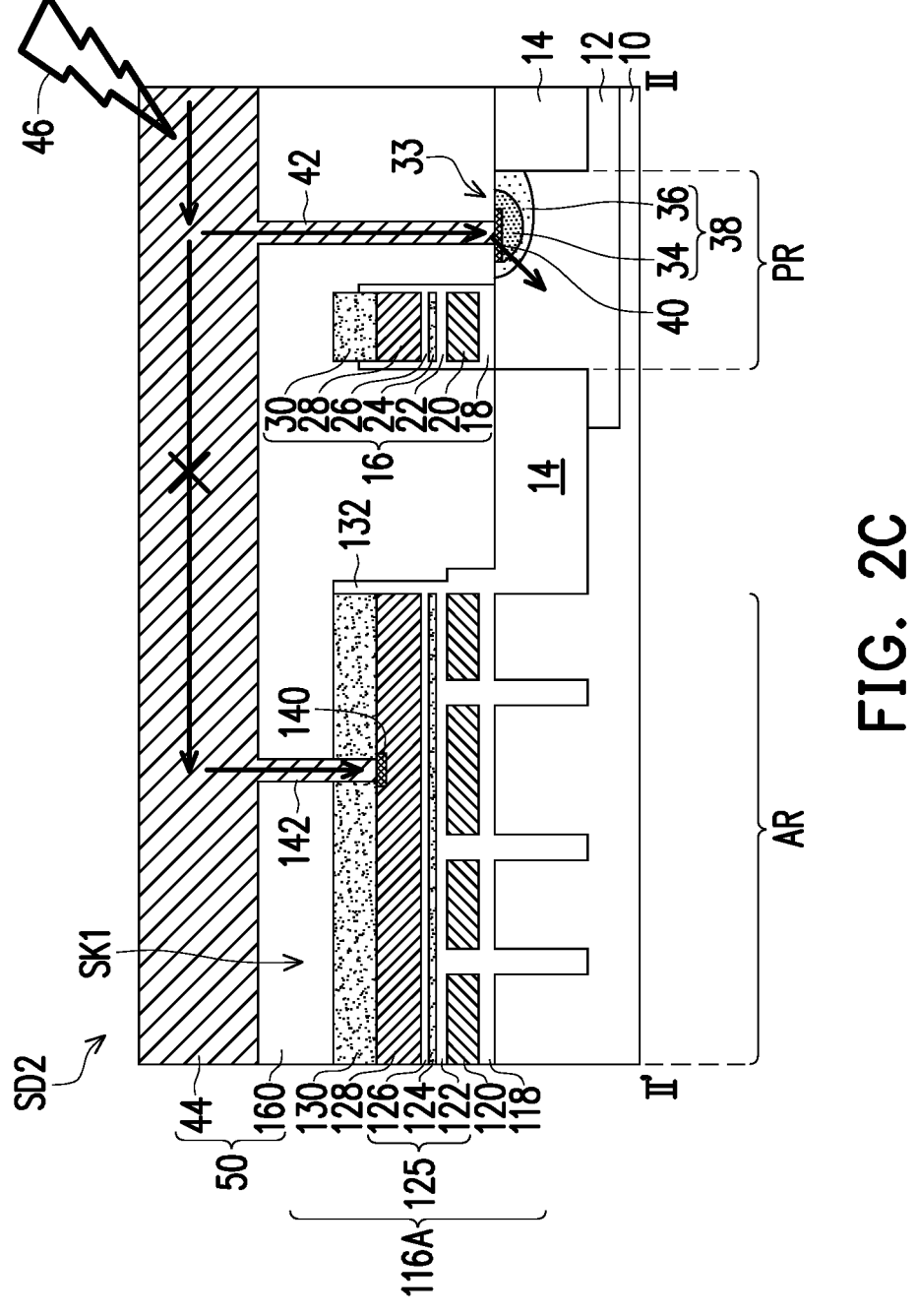
FIG. 2C is another cross-sectional view taken along the line II-II' of FIG. 2A.

FIG. 2A is a top view of a semiconductor device according to an embodiment of the present disclosure. FIG. 2B is a cross-sectional view taken along the line II-II' of FIG. 2A. FIG. 2C is another cross-sectional view taken along the line II-II' of FIG. 2A.

Referring to FIG. 2B, a doped ring 38 is located adjacent to a guard ring 16. The doped ring 38 and guard ring 16 are both located within a boundary of the well region 12. The doped ring 38 and the guard ring 16 may partially overlap (as shown in FIG. 2B), or may not overlap (as shown in FIG. 2C) and may be separated from each other by a non-zero distance. The doped ring 38 is located outside of the guard ring 16, so the doped ring 38 is farther away from the first region AR than the guard ring 16.

The doped ring 38 is located in the well region 12 of the second region PR, as shown in FIG. 2B. Referring to FIG. 2A, the doped ring 38 includes a first doped region 38A and multiple second doped regions 38B. The first doped region 38A is a non-closed open ring, and is located in the well region 12 surrounding the first region AR, for example. In other words, the first doped region 38A has an opening 38C. The second doped regions 38B are located in the well region 12 of the opening 38C. The second doped regions 38B are island-shaped and separated from each other, for example. In other words, the doped ring 38 formed by the first doped region 38A and multiple second doped regions 38B is a non-closed ring.

The lightly-doped region 36 the guard ring 16 may partially overlap (as shown in FIG. 2B), or may not overlap (as shown in FIG. 2C) and may be separated from each other by a non-zero distance. The heavily-doped region 34 and the guard ring 16 may not overlap (as shown in FIG. 2B and FIG. 2C) and may be separated from each other by a non-zero distance.

Figure 3A:
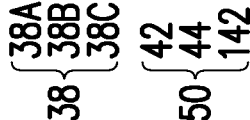
FIG. 3A is a top view of a semiconductor device according to an embodiment of the present disclosure.
Figure 3B:
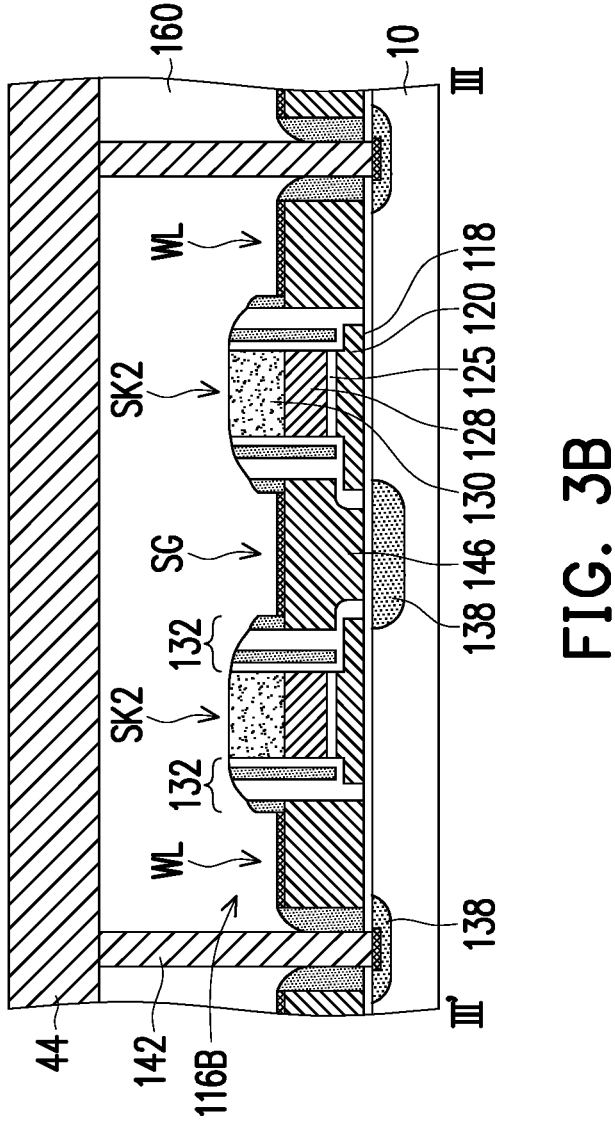
FIG. 3B is a cross-sectional view along the line III-III' of FIG. 3A.
Figure 4A:
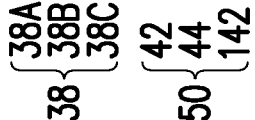
FIG. 4A is a top view of a semiconductor device according to an embodiment of the present disclosure.
Figure 4B:
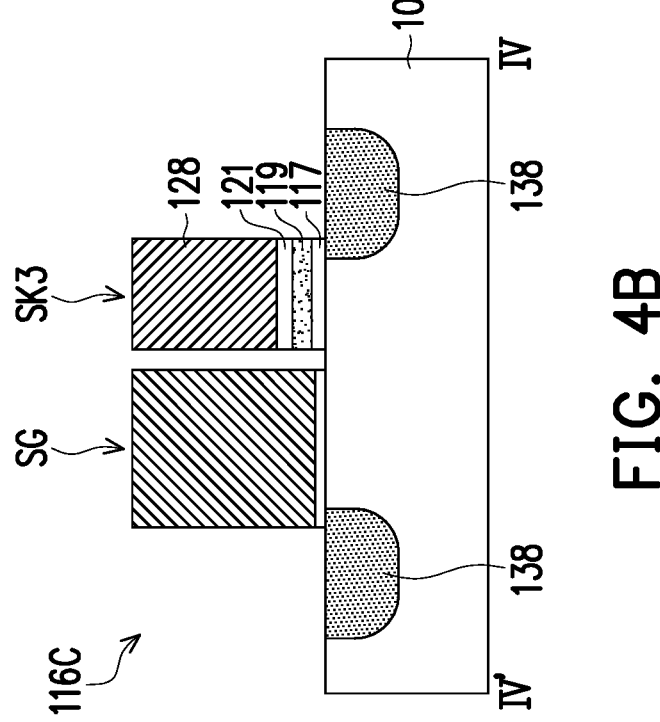
FIG. 4B is a cross-sectional view taken along the line IV-IV' of FIG. 4A.
Figure 5A:
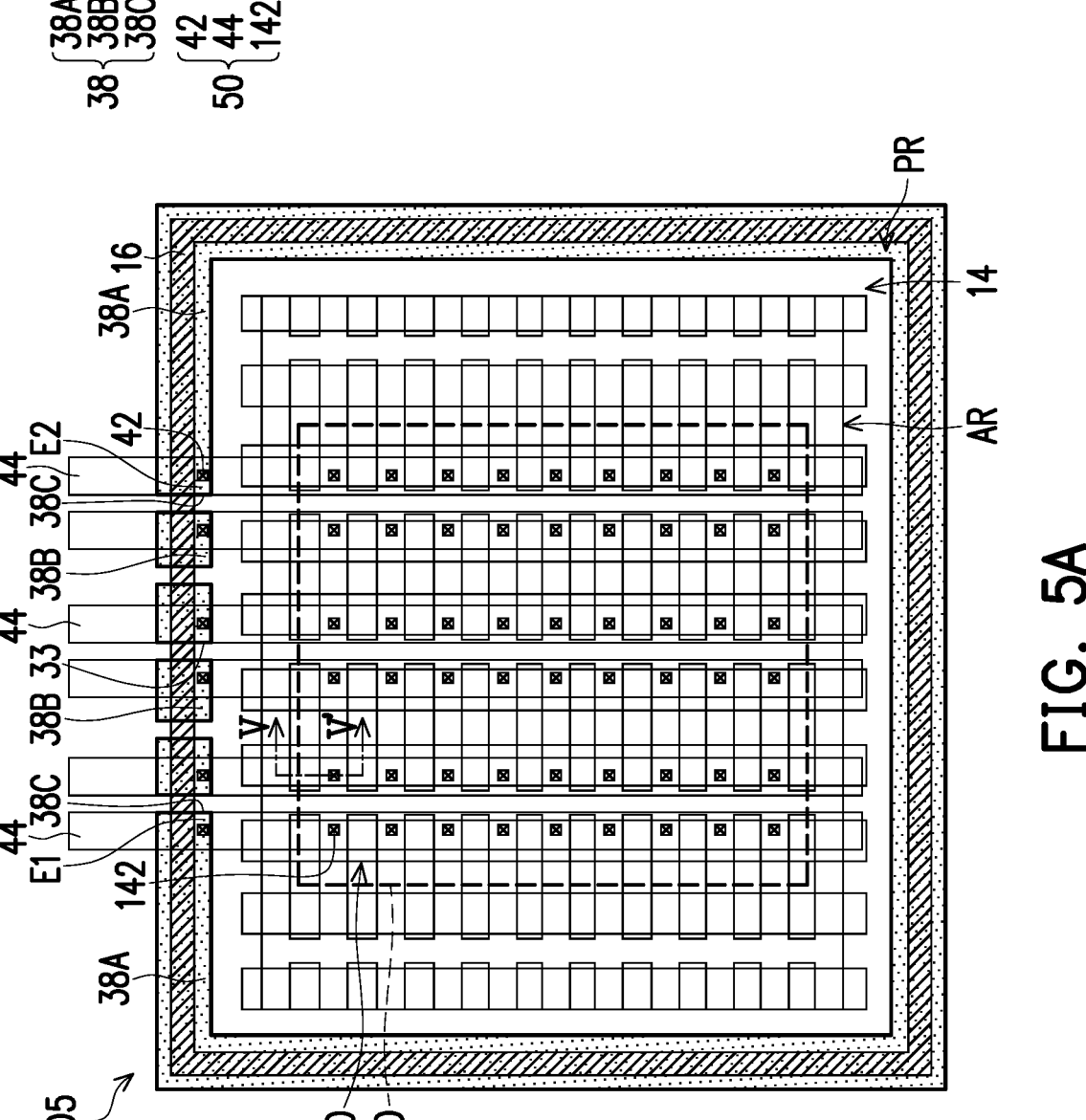
FIG. 5A is a top view of a semiconductor device according to an embodiment of the present disclosure.

The above embodiments are illustrated with the memory device 116A. However, the embodiment of the present disclosure can also be applied to various memory devices 116B, 116C, 116D, as shown in FIG. 3A and FIG. 3B, FIG. 4A and FIG. 4B, and FIG. 5A and FIG. 5B respectively. In FIG. 3A, FIG. 4A and FIG. 5A, diodes 33 are located inside of the guard ring 16 as an example for illustration. However, the embodiments of the present disclosure are not limited thereto. The diodes 33 can also be arranged outside of the guard ring 16, as shown in FIG. 2A and FIG. 2B. Diodes 33 may also have components and structures similar to those of the semiconductor device SD1 or SD4. For the sake of brevity, diodes 33 are not shown in FIG. 3B, FIG. 4B and FIG. 5B.

Figure 5B:
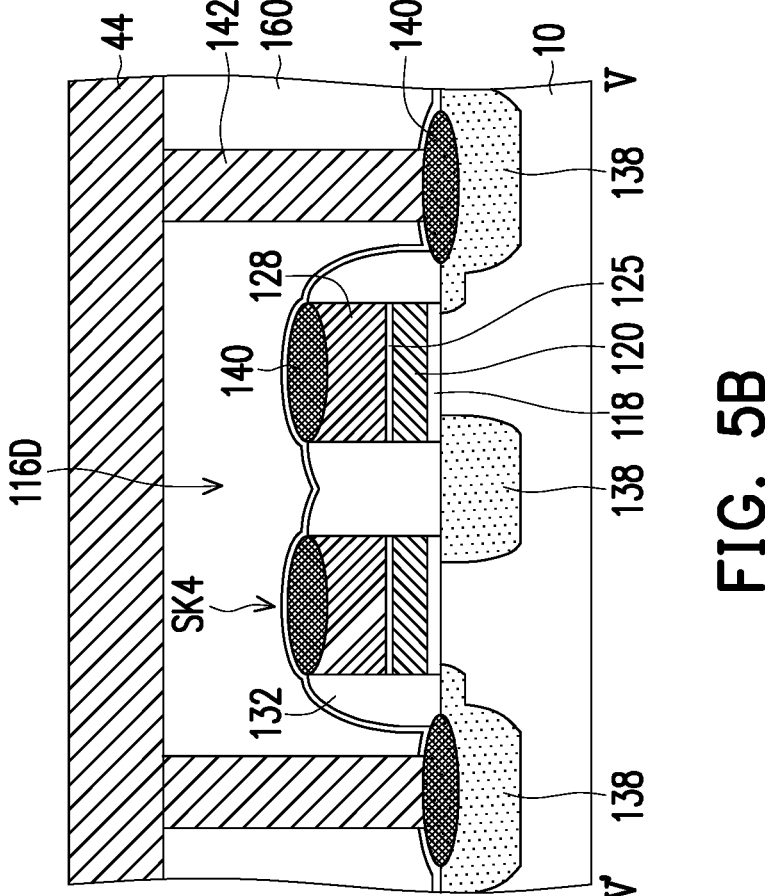
FIG. 5B is a cross-sectional view taken along the line V-V' of FIG. 5A.

FIG. 3A is a top view of a semiconductor device according to an embodiment of the present disclosure. FIG. 3B is a cross-sectional view along the line III-III' of FIG. 3A. FIG. 4A is a top view of a semiconductor device according to an embodiment of the present disclosure. FIG. 4B is a cross-sectional view taken along the line IV-IV' of FIG. 4A. FIG. 5A is a top view of a semiconductor device according to an embodiment of the present disclosure. FIG. 5B is a cross-sectional view taken along the line V-V' of FIG. 5A.

Referring to FIG. 3A and FIG. 3B, the memory device 116B within the area 100B of the semiconductor device SD3 includes a gate stack structure SK2, a select gate structure SG, a word line structure WL, and a doped region 138. The gate stack structure SK2 includes a tunneling layer 118, a floating gate layer 120, an inter-gate dielectric layer 125, a control gate layer 128, a cap layer 130 and a spacer 132. The select gate structure SG is located between two adjacent gate stack structures SK2. The word line structure WL is located outside of the two gate stack structures SK2. Each of the select gate structure SG and the word line structure WL includes a gate dielectric layer and a gate conductive layer. The doped region 138 is located in the substrate outside of two word line structures WL and below the select gate structure SG. The semiconductor device SD3 may further include metal silicide layers on the select gate structure SG and the gate conductive layer of the word line structure WL.

The guard ring 16 may have components and structures similar to those of the gate stack structure SK2, and for the sake of simplicity, the detailed components of the guard ring 16 are not shown.

Referring to FIG. 4A and FIG. 4B, the memory device 116C within the area 100C of the semiconductor device SD4 includes a gate stack structure SK3, a select gate structure SG and a doped region 138. The gate stack structure SK3 includes a tunneling layer 117, a charge storage layer 119, a blocking layer 121 and a control gate layer 128. The tunneling layer 117 may include silicon oxide. The charge storage layer 119 may include silicon nitride. The blocking layer 121 may include silicon oxide. The control gate layer 128 may include polysilicon. The select gate structure SG includes a gate dielectric layer and a gate conductive layer. The doped region 138 is in the substrate 10 outside of the gate stack structure SK3 and the select gate structure SG.

The guard ring 16 may have components and structures similar to those of the gate stack structure SK3, and for the sake of simplicity, the detailed components of the guard ring 16 are not shown.

Referring to FIG. 5A and FIG. 5B, the memory device 116D of semiconductor device SD5 includes gate stack structure SK4. The gate stack structure SK4 includes a tunneling layer 118, a floating gate layer 120, an inter-gate dielectric layer 125, a control gate layer 128 and a metal silicide layer 140. The metal silicide layer 140 covers most or all of the top surface of control gate layer 128. The metal silicide layer 140 further covers the top surface of the doped region 130.

The guard ring 16 may have components and structures similar to those of the gate stack structure SK4, for the sake of simplicity, the detailed components of the guard ring 16 are not shown.

To sum up, the embodiment of the present disclosure protects the memory device by disposing diodes, and therefore prevents the plasma discharge used in the subsequent metallization process from damaging the gate dielectric layer or the tunneling layer of a memory device, and accordingly improves the retention performance of the memory device. The diodes may partially overlap or may not overlap with the guard ring. The diodes may be located between the guard ring and the memory array, or located outside of the guard ring.

What is claimed is:

1. A semiconductor device, comprising:
    a substrate, comprising a first region and a second region, wherein the second region surrounds the first region;

a doped ring, located in the substrate in the second region, and surrounding the first region, wherein the doped ring comprises:

a first doped region, located in the substrate in the second region, and surrounding the first region, wherein the first doped region has an opening; and a plurality of second doped regions, separated from each other, and located in the opening;

a plurality of contacts, electrically connected to the plurality of second doped regions and ends of the first doped region; and a plurality of conductive lines, connected to the plurality of contacts, and connected to a plurality of conductive layers in the first region.

2. The semiconductor device of claim 1, wherein the plurality of conductive lines are connected to a plurality of control gates and a plurality of decoders of the plurality of control gates.

3. The semiconductor device of claim 1, further comprising a guard ring located on the substrate in the second region adjacent to the doped ring.

4. The semiconductor device of claim 3, wherein the guard ring partially overlaps with the doped ring.

5. The semiconductor device of claim 3, wherein the guard ring does not overlap with the doped ring.

6. The semiconductor device of claim 3, wherein the doped ring is closer to the first region than the guard ring.

7. The semiconductor device of claim 3, wherein the doped ring is farther away from the first region than the guard ring.

8. The semiconductor device of claim 3, wherein each of the first doped region and the plurality of second doped regions comprises:

a lightly-doped region, located in a well region, wherein the well region is located in the substrate at least in the second region; and a heavily-doped region, located in the lightly-doped region, wherein a conductivity type of a dopant in the well region is different from a conductivity type of a dopant in the lightly-doped region and the heavily-doped region.

9. The semiconductor device of claim 8, wherein the guard ring is located within the well region.

10. The semiconductor device of claim 8, further comprising a metal silicide layer located on the heavily-doped region.

11. The semiconductor device of claim 8 further comprising an isolation structure located between the first region and the second region.

12. A semiconductor device, comprising:

a substrate, comprising a first region and a second region, wherein the second region surrounds the first region;

a plurality of memory devices, located in the first region;

a plurality of diodes, located in the substrate in the second region;

a plurality of contacts, electrically connected to the plurality of diodes; and a plurality of conductive lines, connected to the plurality of contacts and connected to the plurality of memory devices, wherein each of the diodes comprises:

a well region, located in the substrate in the second region;

a lightly-doped region, located in the well region; and a heavily-doped region, located in the lightly-doped region, wherein a conductivity type of a dopant in the well region is different from a conductivity type of a dopant in the lightly-doped region and the heavily-doped region.

13. The semiconductor device of claim 12, further comprising:

a metal silicide layer, located on the heavily-doped region.

14. The semiconductor device of claim 12, further comprising a guard ring located on the substrate in the second region and adjacent to the plurality of diodes.

15. The semiconductor device of claim 14, wherein the guard ring partially overlaps with the plurality of diodes.

16. The semiconductor device of claim 14, wherein the guard ring does not overlap with the plurality of diodes.

17. The semiconductor device of claim 14, wherein the plurality of diodes are closer to the first region than the guard ring.

18. The semiconductor device of claim 14, wherein the plurality of diodes are farther away from the first region than the guard ring.

19. The semiconductor device of claim 12, wherein the memory devices comprise a plurality of flash memory devices, and the plurality of conductive lines are connected to a plurality of control gates of the plurality of flash memory devices and a plurality of decoders of the plurality of control gates.

* * * * *